US009640509B1

(12) United States Patent
Yang

(10) Patent No.: US 9,640,509 B1
(45) Date of Patent: May 2, 2017

(54) ADVANCED METAL-TO-METAL DIRECT BONDING

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/280,524

(22) Filed: Sep. 29, 2016

(51) Int. Cl.
*H01L 23/00* (2006.01)

(52) U.S. Cl.
CPC .............. *H01L 24/81* (2013.01); *H01L 24/11* (2013.01); *H01L 24/13* (2013.01); *H01L 24/16* (2013.01); *H01L 24/26* (2013.01); *H01L 24/27* (2013.01); *H01L 24/32* (2013.01); *H01L 24/94* (2013.01); *H01L 2224/11616* (2013.01); *H01L 2224/13019* (2013.01); *H01L 2224/13021* (2013.01); *H01L 2224/13147* (2013.01); *H01L 2224/13565* (2013.01); *H01L 2224/13657* (2013.01); *H01L 2224/13676* (2013.01); *H01L 2224/16148* (2013.01); *H01L 2224/81895* (2013.01); *H01L 2224/81898* (2013.01); *H01L 2224/81905* (2013.01)

(58) Field of Classification Search
CPC ......... H01L 24/32; H01L 24/27; H01L 24/94; H01L 24/26
See application file for complete search history.

(56) References Cited

U.S. PATENT DOCUMENTS 6,291,343 B1   9/2001   Tseng et al.

FOREIGN PATENT DOCUMENTS

EP   1275142        1/2003
WO   0161743 A1    8/2001

OTHER PUBLICATIONS

Warner, K., "Low-Temperature Oxide-Bonded Three-Dimensional Integrated Circuits", 2002 IEEE International SOI Conference, Oct. 2002, pp. 123-125.
Tan, C. S., et al., "Low Temperature Wafer Bonding of Low-k Carbon-Doped Oxide for Application in 3D Integration", Electrochemical and Solid-State Letters, Published Nov. 23, 2009, pp. H27-H29, 13 (2).
Schjolberg-Henriksen, K., et al., "Oxide charges induced by plasma activation for wafer bonding", Sensors and Actuators A, accepted Sep. 9, 2002, pp. 99-105, 102.

(Continued)

*Primary Examiner* — Amar Movva
(74) *Attorney, Agent, or Firm* — Scully, Scott, Murphy & Presser, P.C.; Louis J. Percello, Esq.

(57) ABSTRACT

A first semiconductor structure having a first metallic structure that has a convex outermost surface and a second semiconductor structure having a second metallic structure that has a concave outermost surface are first provided. The first and second metallic structures are provided utilizing liner systems that have an opposite galvanic reaction to the metal or metal alloy that constitutes the first and second metallic structures such that during a planarization process the metal liners have a different removal rate than the metal or metal alloy that constitutes the first and second metallic structures. The first semiconductor structure and the second semiconductor structure are then bonded together such that the convex outermost surface of the first metallic structure is in direct contact with the concave outermost surface of the second metallic structure.

20 Claims, 7 Drawing Sheets

(56) References Cited

OTHER PUBLICATIONS

Eichler, M., et al., "Effects on Silanol Condensation during Low Temperature Silicon Fusion Bonding", Journal of the Electrochemical Society, Published Aug. 20, 2009., pp. H786-H793, 156 (10).
Ventosa, C., et al., "Mechanism of Thermal Silicon Oxide Direct Wafer Bonding", Electrochemical and Solid-State Letters, Published Aug. 4, 2009, pp. H373-H375, 12 (10).

ADVANCED METAL-TO-METAL DIRECT BONDING

BACKGROUND

The present application relates to a semiconductor structure and a method of forming the same. More particularly, the present application relates to a three-dimensional (3D) bonded semiconductor structure including two semiconductor structures having metallic structures that are directly bonded together in which the mechanical strength and the electrical contact of the metal-to-metal bonding is enhanced. The present application also relates to a method of forming such a 3D bonded semiconductor structure.

Three-dimensional (3D) integration is critical in current and in future technology development. In modern 3D integration technology development, low temperature metal-to-metal, such as, for example, copper (Cu)-to copper (Cu), direct bonding is performed to both electrically and mechanically contact two wafers. Accordingly, both mechanical bonding strength and electrical contact of the metal/metal interface are critical in order to meet the reliability requirement as well as the electrical performance requirement. There is thus a need for providing a method of forming a 3D bonded semiconductor structure that can enhance the mechanical strength as well as the electrical contact of a metal-to-metal bond.

SUMMARY

A first semiconductor structure having a first metallic structure that has a convex outermost surface and a second semiconductor structure having a second metallic structure that has a concave outermost surface are first provided. The first and second metallic structures are provided utilizing liner systems that have an opposite galvanic reaction to the metal or metal alloy that constitutes the first and second metallic structures such that during a planarization process the metal liners have a different removal rate than the metal or metal alloy that constitutes the first and second metallic structures. The first semiconductor structure and the second semiconductor structure are then bonded together such that the convex outermost surface of the first metallic structure is in direct contact with the concave outermost surface of the second metallic structure.

In one aspect of the present application, a three-dimensional (3D) bonded semiconductor structure is provided. In one embodiment, the three-dimensional (3D) bonded semiconductor structure includes a first semiconductor structure comprising a first dielectric material layer, wherein the first dielectric material layer comprises at least a first U-shaped metal liner lining a first opening present in the first dielectric material layer and a first metallic structure having a convex outermost surface present in the first opening and in direct contact with the first U-shaped metal liner. The 3D bonded semiconductor structure further includes a second semiconductor structure comprising a second dielectric material layer, wherein the second dielectric material layer comprises at least a second U-shaped metal liner lining a second opening present in the second dielectric material layer and a second metallic structure having a concave outermost surface present in the second opening and in direct contact with the second U-shaped metal liner. In accordance with the present application, a metal-to-metal bonding interface is present between the convex outermost surface of the first metallic structure and the concave outermost surface of the second metallic structure.

In another aspect of the present application, a method of forming a three-dimensional (3D) bonded semiconductor structure is provided. In one embodiment, the method includes providing a first semiconductor structure comprising a first dielectric material layer, wherein the first dielectric material layer comprises at least a first U-shaped metal liner lining a first opening present in the first dielectric material layer and a first metallic structure having a convex outermost surface present in the first opening and in direct contact with the first U-shaped metal liner. The method further includes providing a second semiconductor structure comprising a second dielectric material layer, wherein the second dielectric material layer comprises at least a second U-shaped metal liner lining a second opening present in the second dielectric material layer and a second metallic structure having a concave outermost surface present in the second opening and in direct contact with the second U-shaped metal liner. After providing the first and second semiconductor structures, the first semiconductor structure is bonded to the second semiconductor structure, wherein the bonding provides a metal-to-metal bonding interface between the convex outermost surface of the first metallic structure and the concave outermost surface of the second metallic structure.

DETAILED DESCRIPTION

Figure 1A:
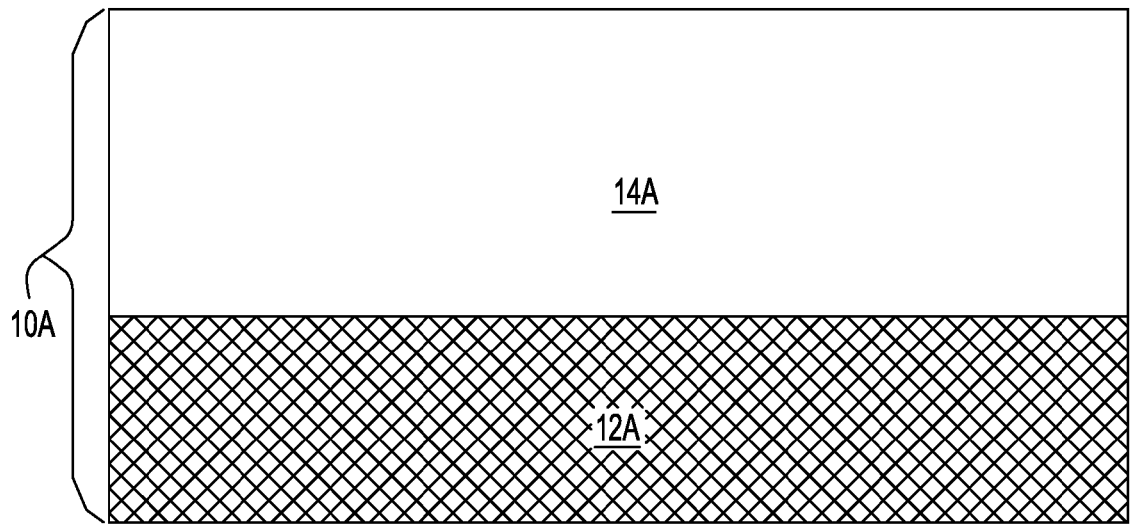
FIG. 1A is a cross sectional view of a first semiconductor structure including a first semiconductor wafer and a first dielectric material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
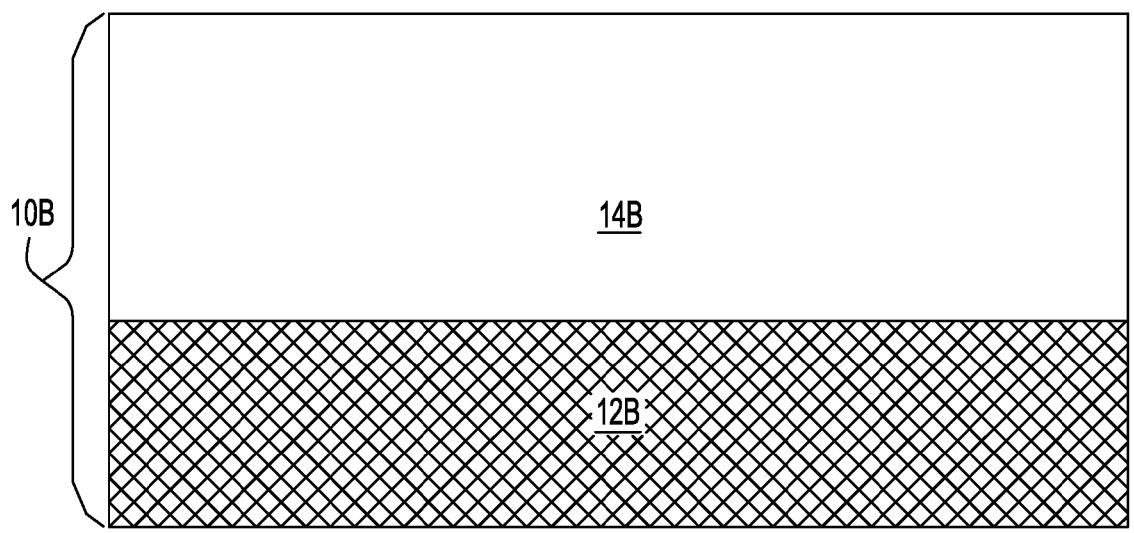
FIG. 1B is a cross sectional view of a second semiconductor structure including a second semiconductor wafer and a second dielectric material layer that can be employed in accordance with an embodiment of the present application.

Referring first to FIGS. 1A-1B, there are shown a first semiconductor structure 10A and a second semiconductor structure 10B that can be employed in accordance with an embodiment of the present application. In the present application and following subsequent processing steps, the first and second semiconductor structures (10A, 10B) will be bonded to each other.

The first semiconductor structure 10A includes a first semiconductor wafer 12A and a first dielectric material layer 14A. As is shown in FIG. 1A, the first dielectric material layer 14A is a continuous (i.e., without any breaks or voids) layer that is present on the entirety of the first semiconductor wafer 12A. The second semiconductor structure 10B includes a second semiconductor wafer 12B and a second dielectric material layer 14B. As is shown in FIG. 1B, the second dielectric material layer 14B is a continuous (i.e., without any breaks or voids) layer that is present on the entirety of the second semiconductor wafer 12B.

The first semiconductor wafer 12A and the second semiconductor wafer 12B both include a semiconductor substrate (not separately shown) having one or more semiconductor devices (also not separately shown) formed thereon. The first and second semiconductor wafers (12A, 12B) may also include one or more interconnect structures (also not shown) located above the semiconductor substrate containing the one or more semiconductor devices. The first semiconductor structure 10A may include the same components as, or different components than, the second semiconductor structure 10B.

The semiconductor substrate that can be used as a component of the first and second semiconductor wafers (12A, 12B) may include a semiconductor material that has semiconducting properties. The semiconductor material that can provide the semiconductor substrate of the first and second semiconductor wafers (12A, 12B) may include, but is not limited to, silicon (Si), germanium (Ge), silicon germanium alloys (SiGe), silicon carbide (SiC), III-V compound semiconductors, II-VI compound semiconductors or multilayered combinations thereof. In some embodiments, the semiconductor material that provides the semiconductor substrate of the first semiconductor wafer 12A may be the same as a semiconductor material that provides the semiconductor substrate of the second semiconductor wafer 12B. In yet other embodiments, the semiconductor material that provides the semiconductor substrate of the first semiconductor wafer 12A may be different from the semiconductor material that provides the semiconductor substrate of the second semiconductor wafer 12B.

In some embodiments, the semiconductor substrate of the first and second semiconductor wafers (12A, 12B) may be a bulk crystalline substrate. The term "bulk" denotes the entirety of the crystalline substrate is composed of at least one crystalline material with no insulators and/or conductive materials present therein.

In yet other embodiments, the semiconductor substrate of the first and second semiconductor wafers (12A, 12B) may be a semiconductor-on-insulator (SOI) including, from bottom to top, a handle substrate, an insulator layer and a topmost crystalline semiconductor layer. In some embodiments, the handle substrate may be composed of one of the semiconductor materials mentioned above. In other embodiments, the handle substrate may be composed of a dielectric material or a conductive material. In yet other embodiments, the handle substrate may be omitted. The insulator layer of the SOI substrate may be composed of a dielectric oxide, dielectric nitride or a multilayered stack thereof. In one example, the insulator layer of the SOI substrate may be composed of silicon dioxide and/or silicon nitride. The topmost semiconductor layer of the SOI substrate may be composed of one of the semiconductor materials mentioned above. The SOI can be formed utilizing well known processes including, for example, a layer transfer process, or by a SIMOX (separation by ion implantation of oxygen) process.

The one or more semiconductor devices that can be present on the semiconductor substrate of the first and second semiconductor wafers (12A, 12B) may include, for example, transistors, capacitors, diodes, and/or resistors. The one or more semiconductor devices can be formed utilizing techniques that are well known in the semiconductor industry. For example, transistors may be formed utilizing a gate-first process or a gate-last process (also referred as to a replacement gate process). So as not to obscure the processing steps of the present application, the materials and techniques used in forming the one or more semiconductor devices are not described herein in detail.

The one or more interconnect structures that can be present as a component of the first and second semiconductor structures (10A, 10B) may also include any conventional interconnect structure including a metallic interconnect structure embedded within an interconnect dielectric material. So as not to obscure the processing steps of the present application, the materials and techniques used in forming the one or more interconnect structures are not described herein in detail.

As mentioned above, the first semiconductor structure 10A includes a first dielectric material layer 14A, while the second semiconductor structure 10B includes a second dielectric material layer 14B. The first and second dielectric material layers (14A, 14B) may include any interlevel or intralevel dielectric material including inorganic dielectrics or organic dielectrics. A single interlevel or intralevel dielectric material may be used, or a multilayered dielectric material stack of at least two different interlevel or intralevel dielectrics may be used. In one embodiment, the first and second dielectric material layers (14A, 14B) may be non-porous. In another embodiment, the first and second dielectric material layers (14A, 14B) may be porous. Some examples of suitable dielectrics that can be used as the first and second dielectric material layers (14A, 14B) include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments, the dielectric material that provides the first dielectric material layer 14A is the same as the dielectric material that provides the second dielectric material layer 14B. In other embodiments, the dielectric material that provides the first dielectric material layer 14A is different from the dielectric material that provides the second dielectric material layer 14B.

The dielectric material that provides the first and second dielectric material layers (14A, 14B) typically has a dielectric constant that is about 4.0 or less, with a dielectric constant of about 2.8 or less being more typical. All dielectric constants mentioned herein are relative to a vacuum, unless otherwise noted. These dielectric materials generally have a lower parasitic cross talk as compared with dielectric materials that have a higher dielectric constant than 4.0. The thickness of dielectric material that provides the first and second dielectric material layers (14A, 14B) may vary depending upon the type of dielectric material(s) used. In one example, the dielectric material that provides the first and second dielectric material layers (14A, 14B) may have a thickness from 50 nm to 1000 nm. Other thicknesses that are lesser than, or greater than, the aforementioned thickness range may also be employed in the present application for the thickness of the dielectric material that provides first and second dielectric material layers (14A, 14B).

The dielectric material that provides the first and second dielectric material layers (14A, 14B) may be formed utilizing a deposition process such as, for example, chemical vapor deposition (CVD), plasma enhanced chemical vapor deposition (PECVD) or spin-on coating.

Figure 2A:
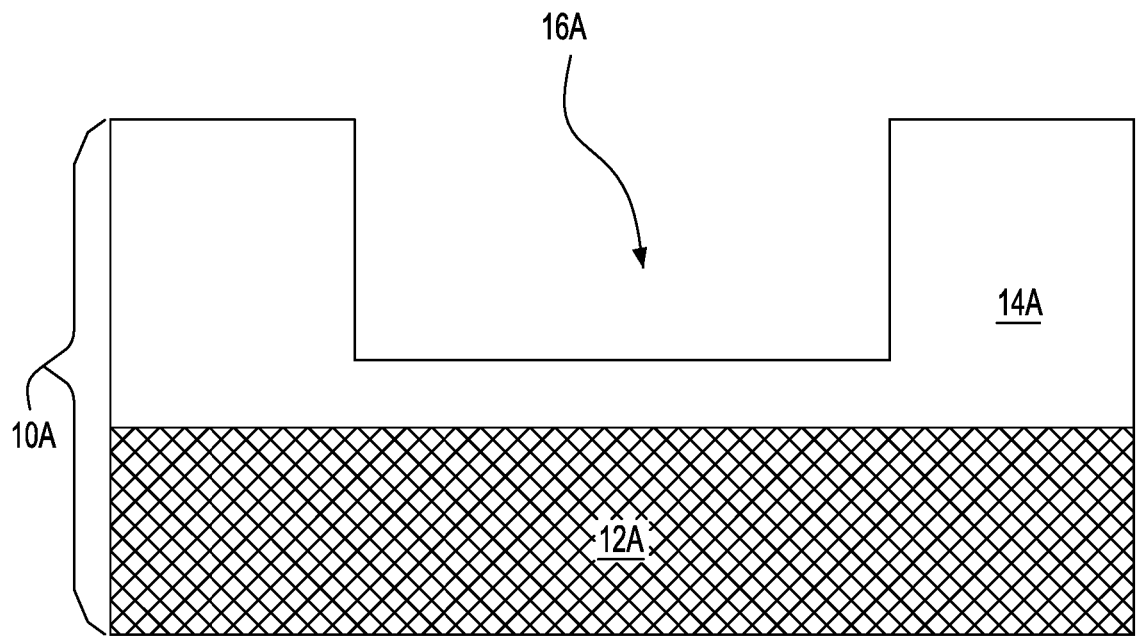
FIG. 2A is a cross sectional view of the first semiconductor structure of FIG. 1A after forming at least one first opening into the first dielectric material layer.
Figure 2B:
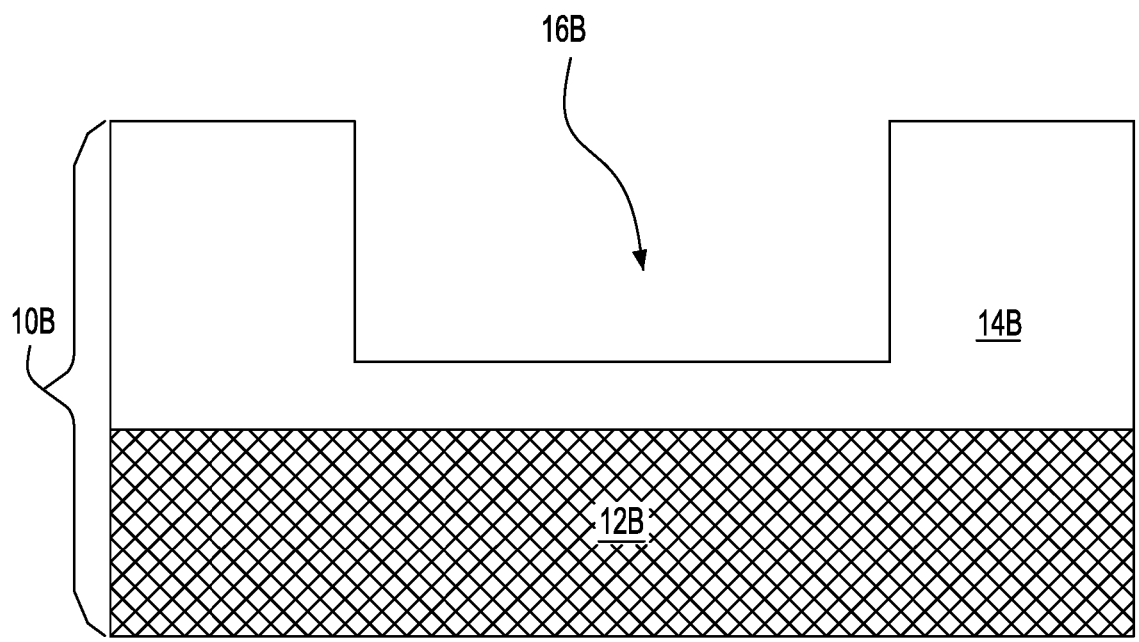
FIG. 2B is a cross sectional view of the second semiconductor structure of FIG. 1B after forming at least one second opening into the second dielectric material layer.

Referring now to FIGS. 2A and 2B, there are shown the first and second semiconductor structures (10A, 10B) shown in FIGS. 1A and 1B, respectively, after forming an opening into each respective dielectric material layer. Notably, FIG. 2A illustrates the first semiconductor structure 10A of FIG. 1A after forming at least one first opening 16A into the first dielectric material layer 14B, while FIG. 2B illustrates the second semiconductor structure 10B of FIG. 1B after forming at least one second opening 16B into the second dielectric material layer 14B. Although the present application describes and illustrates forming a single first opening 16A into the first dielectric material layer 14A and a single second opening 16B into the second dielectric material layer 14B, a plurality of first openings can be formed into the first dielectric material layer 14A and/or a plurality of second openings can be formed into the second dielectric material layers 14B.

The first and second opening (16A, 16B) can be formed utilizing a patterning process. In one embodiment, the patterning process may include lithography and etching. The lithographic process includes forming a photoresist (not shown) atop a material or material stack to be patterned, i.e., the first and second dielectric material layers (14A, 14B), exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the first and second openings (16A, 16B) into the respective dielectric material layer (14A, 14B).

The first and second openings (16A, 16B) may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIGS. 2A and 2B, and by way of an example, the first and second openings (16A, 16B) are both via openings. When a combined via/line is formed a dual damascene process (including at least one iteration of the above mentioned lithography and etching steps) can be employed.

Figure 3A:
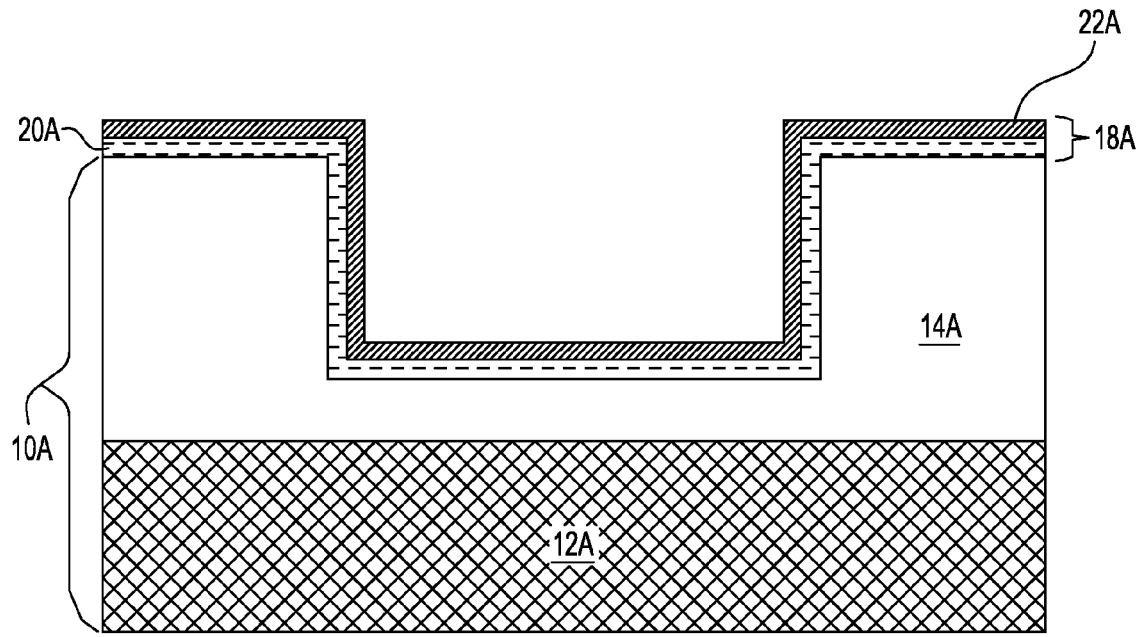
FIG. 3A is a cross sectional view of the first semiconductor structure of FIG. 2A after forming a first liner system including at least a first metal liner within the first opening and on a topmost surface of the first dielectric material layer.
Figure 3B:
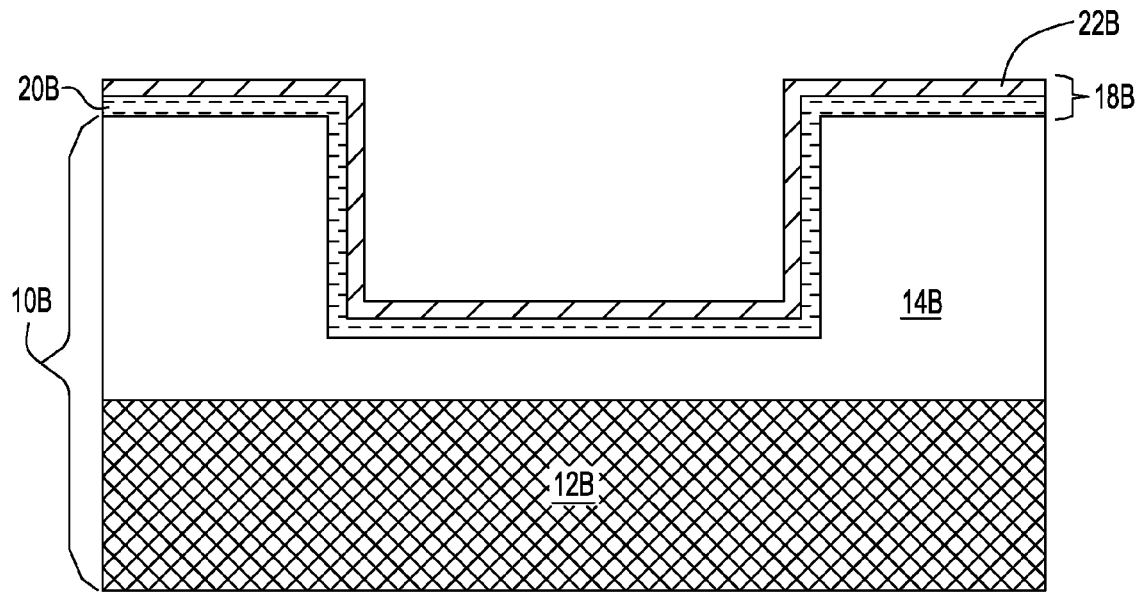
FIG. 3B is a cross sectional view of the second semiconductor structure of FIG. 2B after forming a second liner system including at least a second metal liner within the second opening and on a topmost surface of the second dielectric material layer, wherein the second metal liner is composed of a metal that differs from a metal that provides the first metal liner.

Referring now to FIGS. 3A and 3B, there are shown the first and second semiconductor structures (10A, 10B) shown in FIGS. 2A and 2B, respectively, after forming a liner system. Notably, FIG. 3A illustrates the first semiconductor structure 10A of FIG. 2A after forming a first liner system 18A including at least a first metal liner 22A within the first opening 16A and on a topmost surface of the first dielectric material layer 14A, while FIG. 3B illustrates the second semiconductor structure 10B of FIG. 2B after forming a second liner system 18B including at least a second metal liner 22B within the second opening 16B and on a topmost surface of the second dielectric material layer 14B. The first liner system 18A and the second liner system 18B may be formed in any order.

In accordance with the present application, the second metal liner 22B of the second liner system 18B is composed of a metal that differs from a metal that provides the first metal liner 22A of the first liner system 18A. The metal that provides the respective metal liner must also be different from the metal or metal alloy that provides the subsequently formed layer of metal or metal alloy.

The different metals for the first metal liner 22A and the second metal liner 22B are chosen to provide an opposite galvanic reaction to a subsequently formed layer of metal or metal alloy. The term "galvanic reaction" denotes the process by which two dissimilar metals (i.e., the metal liner and the subsequently formed layer of metal or metal alloy) that are in contact with each other begin to oxide or corrode. It is noted that for a galvanic reaction to occur the following three conditions need to meet. First, there must be two electrochemical dissimilar metals present (in the present case the metal liner differs from the layer of metal or metal alloy to be subsequently formed). Second, there must be an electrically conductive path between the more anodic metal to the more cathodic metal (in the present application and during a subsequently performed planarization process there is an electrically conductive path between the metal liners and the layers of metal or metal alloy to be subsequently formed). Third, there must be a conductive path for the metal ions to moved from the more anodic metal to the more cathodic metal (in the present application and during a subsequently performed planarization process there is a electrically conductive path between the metal liners and the layers of metal or metal alloy to be subsequently formed).

In the present application, one of the metal liners is chosen to provide a negative, i.e., slower, galvanic reaction with one of the subsequently formed layers of metal or metal alloy, while the other of the metal liners is chosen to provide a positive, i.e., faster, galvanic reaction to the other subsequently formed layer of metal or metal alloy. The metal liner that provides the negative galvanic reaction to one of the subsequently formed layers of metal or metal alloy will be employed to provide a metallic structure having a convex outermost surface, while the metal liner that provides the position galvanic reaction to the other subsequently formed layer of metal or metal alloy will be employed to provide a metallic structure having a concave outermost surface.

By way of illustration, the first metal liner 22A is chosen to provide a negative galvanic reaction, while the second metal liner 22B is chosen to provide the positive galvanic reaction. In such an embodiment, the first metal liner 22A is composed of a metal that is less noble (i.e., has a higher oxidation rate) than the metal or metal alloy of the first layer of metal or metal alloy to be subsequently formed, while the second metal liner 22B is composed of a metal that is more noble (slower oxidation rate) than the metal or metal alloy of the second layer of metal or metal alloy to be subsequently formed. In one example, and when copper (Cu) is used as the first layer of metal or metal alloy and the second layer of metal or metal alloy, cobalt (Co) can be used as the first metal liner 22A, and ruthenium (Ru) can be used as the second metal liner 22B.

The first and second metal liners (22A, 22B) can be formed as a continuous layer utilizing a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The first and second metal liners (22A, 22B) may have a thickness from 1 nm to 50 nm; although other thicknesses for the diffusion barrier material are contemplated and can be employed in the present application so long as the respective opening is not entirely filled with the first and second metal liners (22A, 22B).

In some embodiments, the first metal liner 22A is a sole component of the first liner system 18A, and the second metal liner 22B is a sole component of the second liner system 18B. In such an embodiment, the first metal liner 22A directly contacts exposed surfaces of the first dielectric material layer 14A, while the second metal liner 22B directly contacts the exposed surfaces of the second dielectric material layer 14B.

In yet other embodiments, a diffusion barrier liner can be positioned between the metal liner and the dielectric material layer. For example, a first diffusion barrier liner 20A can be located between the first metal liner 22A and the first dielectric material layer 14A and/or a second diffusion barrier liner 20B can be positioned between the second metal liner 22B and the second dielectric material layer 14B. FIGS. 3A-3B illustrate an embodiment in which both the first and second diffusion barrier liners (20A, 20B) are present. When a diffusion barrier liner is present, the diffusion barrier liner represents a lower liner material of a liner system, while the metal liner represents an upper liner material of the liner system.

When present, the first diffusion barrier liner 20A and the second diffusion barrier liner 20B each comprise a diffusion barrier material. In some embodiments, the first diffusion barrier liner 20A may be composed of a same diffusion barrier material as the second diffusion barrier liner 20B. In other embodiments, the first diffusion barrier liner 20A may be composed of a different diffusion barrier material than the second diffusion barrier liner 20B. The diffusion barrier material that may provide the first and second diffusion barrier liners (20A, 20B) includes Ta, TaN, Ti, TiN, Ru, RuN, RuTa, RuTaN, W, WN or any other material that can serve as a barrier to prevent a metal or metal alloy to be subsequently formed from diffusing there through. In some embodiments, the diffusion barrier material that may provide the first and second diffusion barrier liners (20A, 20B) may have a thickness from 1 nm to 50 nm; although other thicknesses for the diffusion barrier material are contemplated and can be employed in the present application so long as the entirety of the opening is not filled with a diffusion barrier material.

The diffusion barrier material that may provide the first and second diffusion barrier liners (20A, 20B) can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The first diffusion barrier liner 20A may be formed utilizing a same deposition process as, or different deposition process from, that used to provide the second diffusion barrier liner 20B.

Figure 4A:
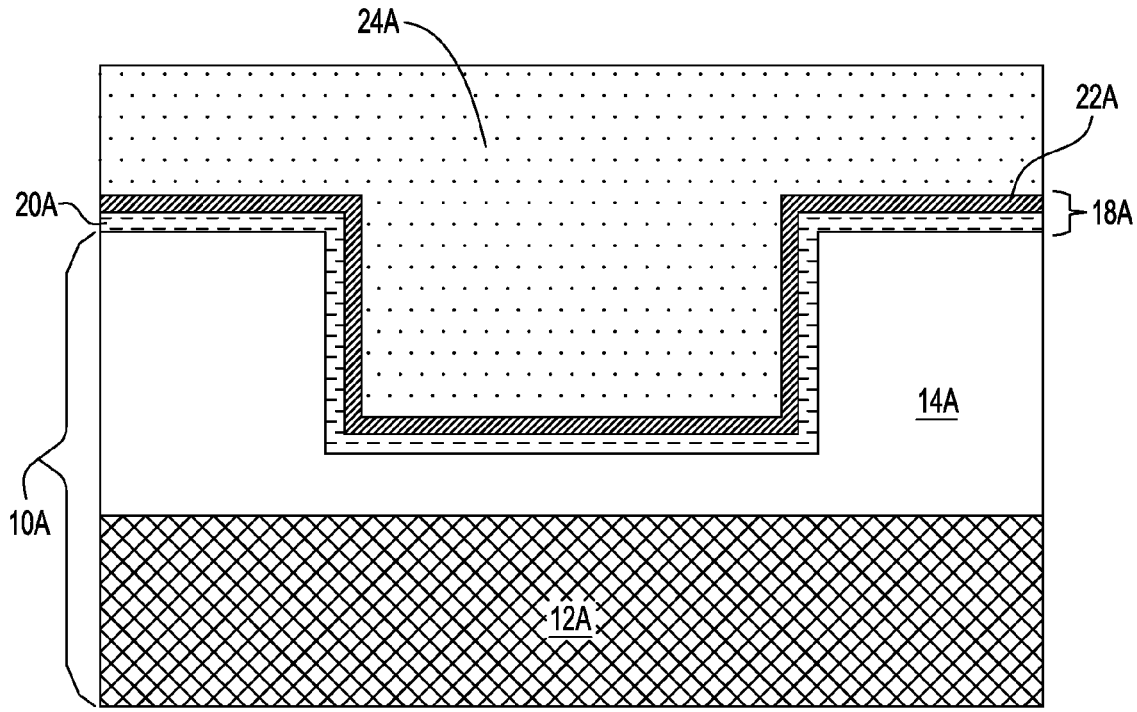
FIG. 4A is a cross sectional view of the first semiconductor structure of FIG. 3A after forming a first layer of a metal or metal alloy on the first metal liner, wherein the metal or metal alloy of the first layer of metal or metal alloy differs from the metal of the first metal liner.
Figure 4B:
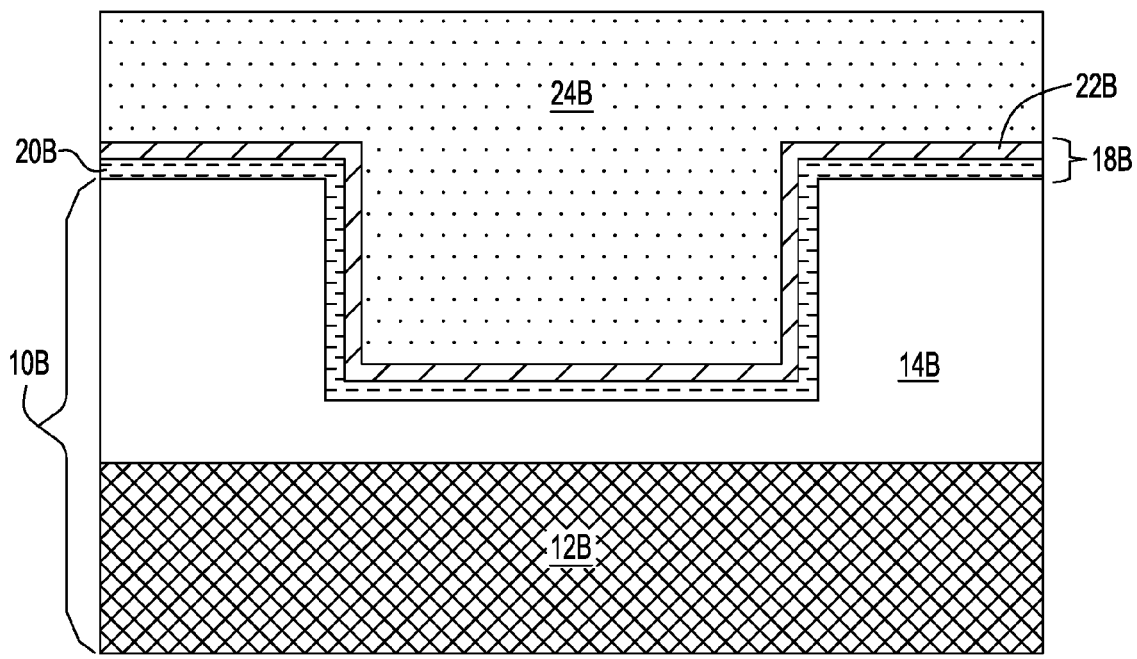
FIG. 4B is a cross sectional view of the second semiconductor structure of FIG. 3B after forming a second layer of a metal or metal alloy on the second metal liner, wherein the metal or metal alloy of the second layer of metal or metal alloy differs from the metal of the second metal liner.

Referring now to FIGS. 4A and 4B, there are shown the first and second semiconductor structures (10A, 10B) shown in FIGS. 3A and 3B, respectively, after forming a layer of metal or metal alloy on the metal liner of each liner system. Notably, FIG. 4A illustrates the first semiconductor structure 10A of FIG. 3A after forming a first layer of a metal or metal alloy 24A on the first metal liner 22A of the first liner system 18A, while FIG. 4B illustrates the second semiconductor structure 10B of FIG. 3B after forming a second layer of a metal or metal alloy 24B on the second metal liner 22B of the second liner system 18B.

The metal or metal alloy that provides the first and second layers of metal or metal alloy (24A, 24B) must be different from the metal used for the respective metal liners (22A, 22B) such that a galvanic reaction is possible. The metal or metal alloy that provides the first and second layers of metal or metal alloy (24A, 24B) may include tantalum (Ta), tungsten (W), cobalt (Co), rhodium (Rh), ruthenium (Ru), aluminum (Al), copper (Cu) or alloys thereof. In one embodiment, the metal or metal alloy that provides the first layer of metal or metal alloy 24A is the same as a metal or metal alloy that provides the second layer of metal or metal alloy 24B. In another embodiment, the metal or metal alloy that provides the first layer of metal or metal alloy 24A is different from the metal or metal alloy that provides the second layer of metal or metal alloy 24B. In either embodiment, and as mentioned above, the metal or metal alloy used to provide layers 24A, 24B must be different from the metals used as the first and second metal liners (22A, 22B).

The metal or metal alloy that provides the first and second layers of metal or metal alloy (24A, 24B) can be formed utilizing a deposition process such as, for example, chemical vapor deposition (CVD), plasma enhanced chemical vapor deposition (PECVD), sputtering, chemical solution deposition or plating. In one embodiment, a bottom-up plating process is employed in forming the metal or metal alloy that provides the first and second layers of metal or metal alloy (24A, 24B). The first layer of metal or metal alloy 24A may be formed utilizing a same deposition process as, or different deposition process from, that used to provide the second layer of metal or metal alloy 24B.

As is shown in the drawings, the first and second layers of metal or metal alloy (24A, 24B) fill in the remaining volume of the respective opening and include an upper portion (also referred to as an overburden portion) that extends outside the opening and above the topmost surface of the dielectric material layer.

Figure 5A:
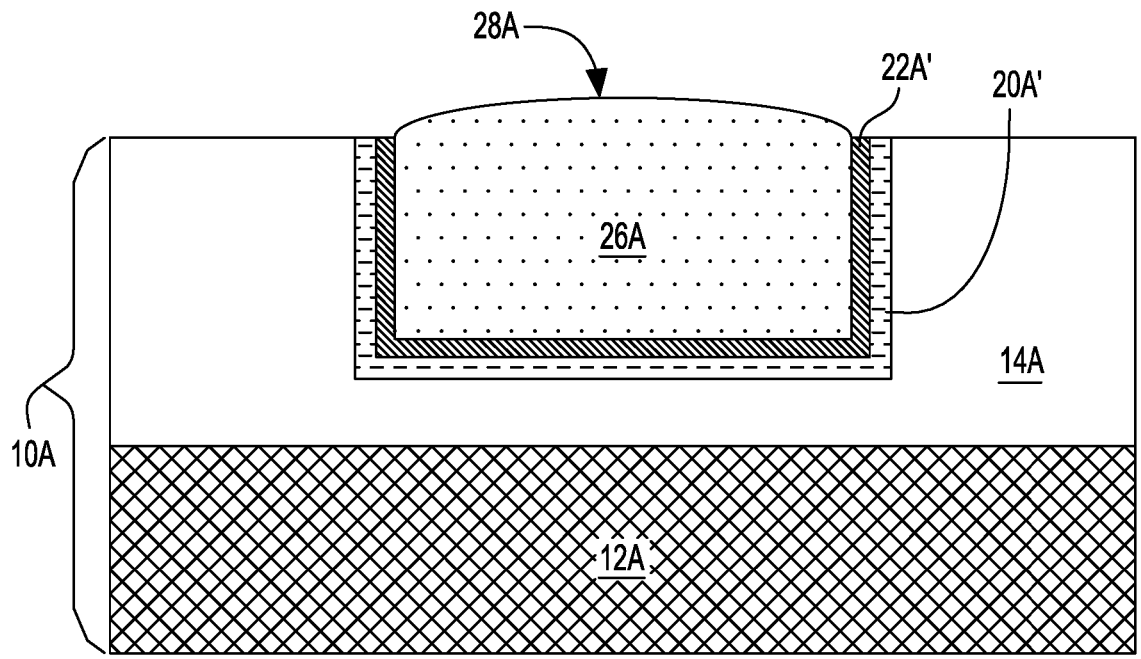
FIG. 5A is a cross sectional view of the first semiconductor structure of FIG. 4A after performing a planarization process in which a first metallic structure having a convex outermost surface is provided.
Figure 5B:
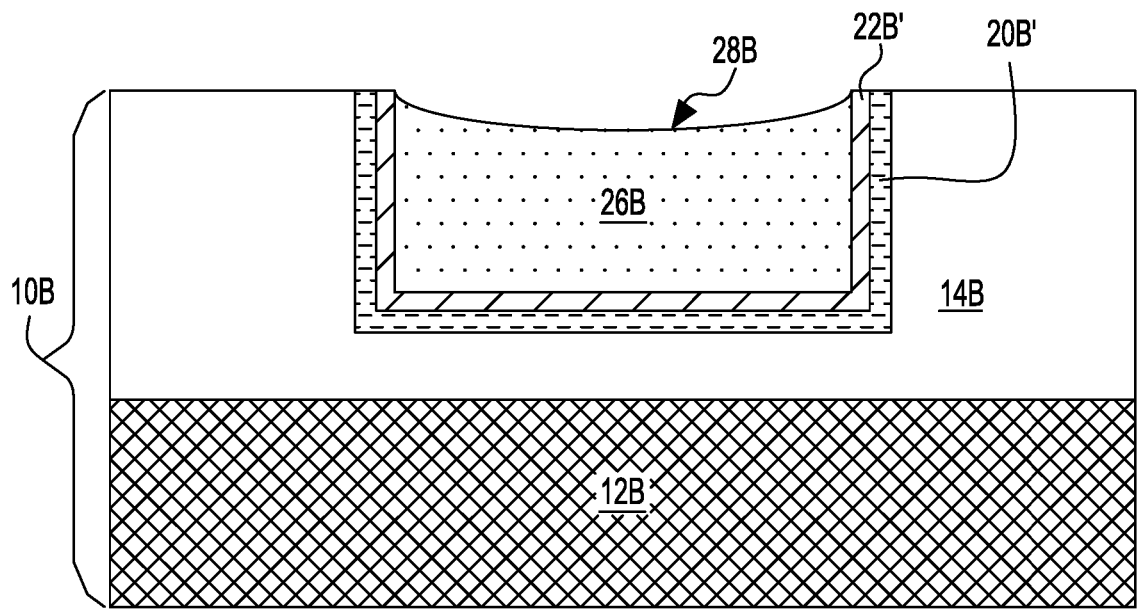
FIG. 5B is a cross sectional view of the second semiconductor structure of FIG. 4B after performing a planarization process in which a second metallic structure having a concave outermost surface is provided.

Referring now to FIGS. 5A and 5B, there are shown the first and second semiconductor structures (10A, 10B) shown in FIGS. 4A and 4B, respectively, after performing a planarization process. Planarization of the structures shown in FIG. 4A and FIG. 4B may be performed simultaneously or in any order. Notably, FIG. 5A illustrates the first semiconductor structure 10A shown in FIG. 4A after performing a planarization process in which a first metallic structure 26A having a convex outermost surface 28A is provided, while FIG. 5B illustrates the second semiconductor structure of FIG. 4B after performing a planarization process in which a second metallic structure 26B having a concave outermost surface 28B is provided. The term "convex" denotes a material in which an upper portion thereof bulges outward, while the term "concave" denotes a metal in which an upper portion thereof bulges inward.

The planarization process removes a portion of each of the first and second layers of metal or metal alloy (24A, 24B), a portion of the first liner system 18A and a portion of the second liner system 18B, while leaving a portion of each of the first and second layers of metal or metal alloy (24A, 24B), a portion of the first liner system 18A and a portion of the second liner system 18B, mainly embedded within each respective opening. The planarization process completely removes each of the first and second layers of metal or metal alloy (24A, 24B), the first liner system 18A and the second line system 18B from atop the dielectric material layer (14A, 14B).

The first metallic structure 26A constitutes a remaining portion of the first layer of metal or metal alloy 24A, while the second metallic structure 26B constitutes a remaining portion of the second layer of metal or metal alloy 24B. The remaining portion of first diffusion barrier liner 20A can be referred to herein as a first U-shaped diffusion barrier liner 20A', the remaining portion of the first metal liner 22A may be referred to herein as a first U-shaped metal liner 22A', the remaining portion of second diffusion barrier liner 20B can be referred to herein as a second U-shaped diffusion barrier liner 20B', and the remaining portion of the second metal liner 22B may be referred to here as a second U-shaped metal liner 22B'. By "U-shaped" it is meant a material that contains a horizontal portion and two vertical portions that extend upward from opposing ends of the horizontal portion. Thus, and after planarization, the first liner system 18A can now be referred to as a first U-shaped liner system, while the second liner system 18B may be referred to as second U-shaped liner system.

In some embodiments (not shown), a recess etch may be performed prior to planarization to remove a portion of the overburden portion of the first and second layers of metal or metal alloy (24A, 24B). During the recess etch, no galvanic reaction occurs.

In the present application, chemical mechanical polishing (CMP) is used as the planarization process to provide the structures shown in FIGS. 5A and 5B; the term 'chemical mechanical planarization' can be used interchangeably with the term 'chemical mechanical polishing'. CMP is a process of smoothing surfaces with the combination of chemical and mechanical forces.

Because each metal liner is dissimilar to the layer of metal or metal alloy, different removal rates occur during the planarization which facilitates the formation of a metallic structure having either the convex or concave outermost surface. For example, and in the embodiment in which Co is employed as the first metal liner 22A, Ru is employed as the second metal liner 22B and Cu is employed as the first and second layers of metal or metal alloy (24A, 24B), Co and Ru have the opposite galvanic reaction to Cu during the planarization process. Since Ru is more noble than Cu, the Ru removal rate during the planarization process is less than the removal rate of Cu, thus the second metallic structure 26B having the concave outermost surface 28B is formed. Also, and since Co is less noble than Cu, the Co removal rate during the planarization process is faster than the removal rate of Cu, thus the first metallic structure 26A having the convex outermost surface 28A is formed.

Figure 6:
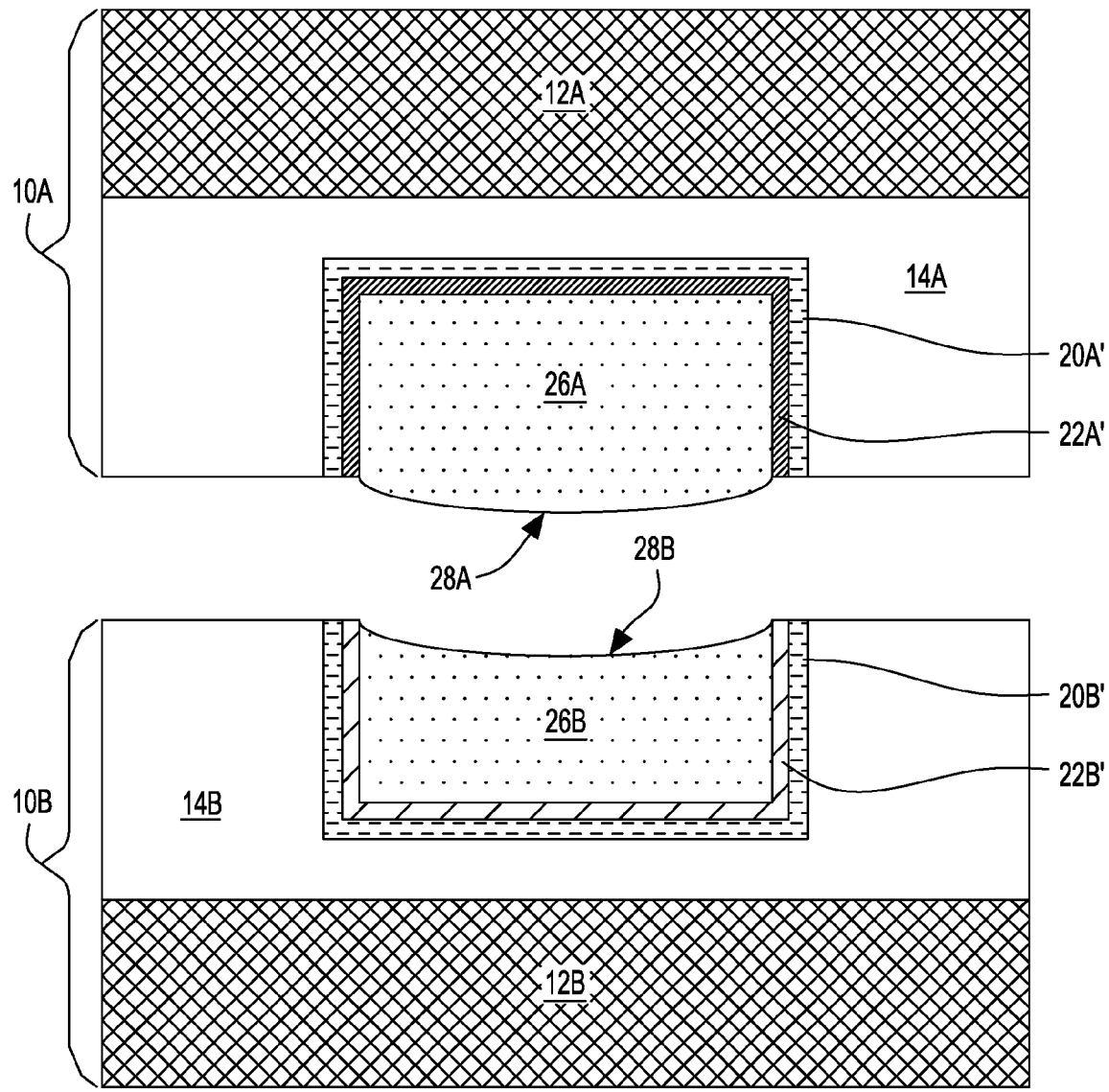
FIG. 6 is a cross sectional view of the first and second semiconductor structures of FIGS. 5A and 5B after performing a wafer-to-wafer alignment process.

Referring now to FIG. 6, there is illustrated the first and second semiconductor structures of FIGS. 5A and 5B after performing a wafer-to-wafer alignment process. The wafer-to-wafer alignment process includes flipping one of the semiconductor structures upside down and placing the flipped semiconductor structure over the unflipped semiconductor structure such that the first metallic structure 26A is aligned with the second metallic structure 26B. In the drawings and by way of one example, the first semiconductor structure 10A is flipped upside down. The wafer-to-wafer alignment may be performed by hand or by utilizing a robot arm.

Figure 7:
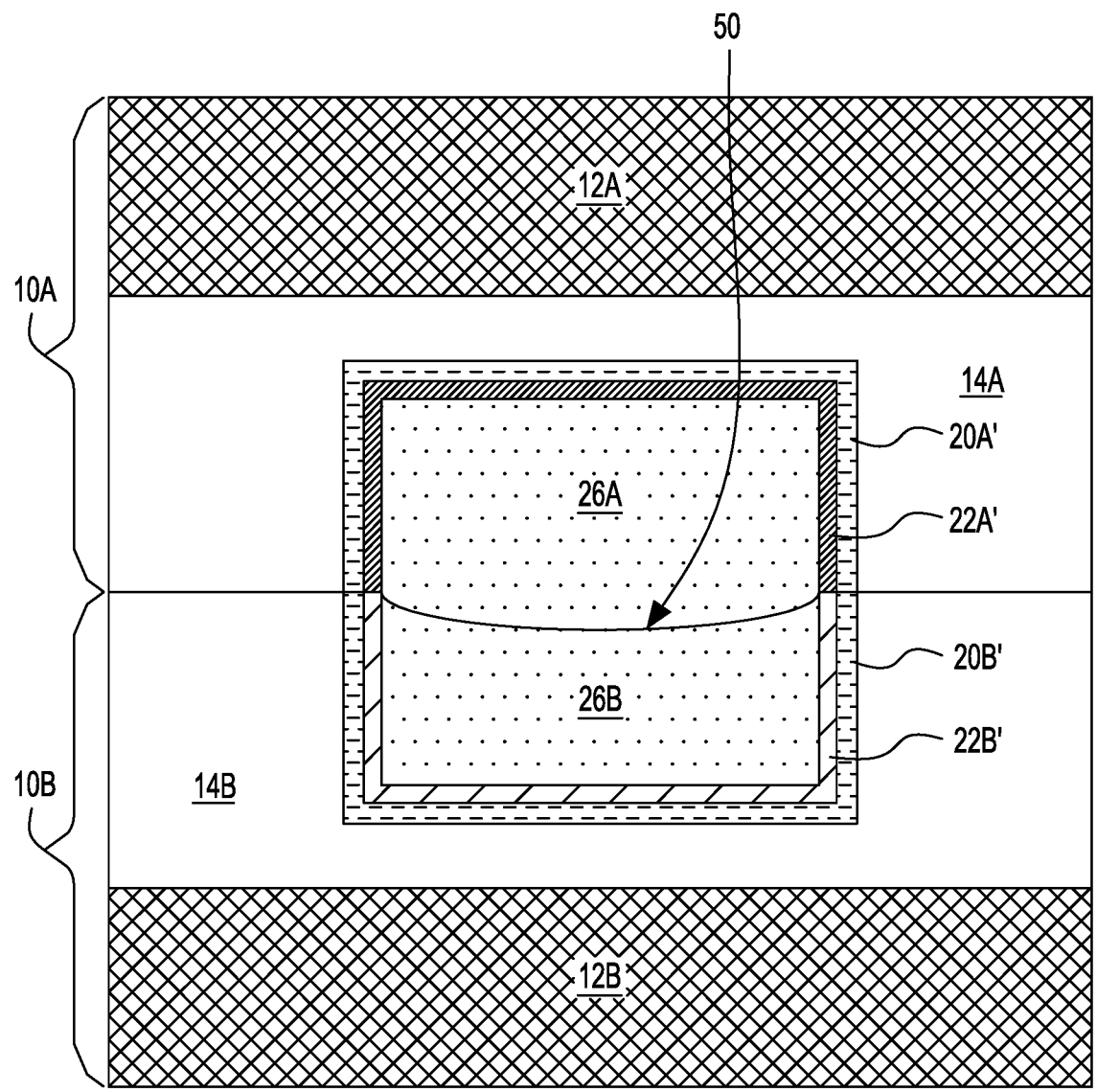
FIG. 7 is a cross sectional view of the first and second semiconductor structures of FIG. 6 after wafer bonding.

Referring now to FIG. 7, there is illustrated the first and second semiconductor structures of FIG. 6 after wafer bonding. Wafer bonding includes bringing the two semiconductor structures (10A, 10B) in intimate contact with each other, with or without application of an external force, and thereafter performing a bonding anneal that permanently bonds the two structures to each other. The bonding anneal may be performed at a temperature from 100° C. to 700° C. and in an ambient including nitrogen, hydrogen, helium or any mixtures thereof (i.e., nitrogen/helium or nitrogen/hydrogen or helium/hydrogen). The resulted structure has a metal-to-metal bond at interface 50 having enhanced mechanical strength and electrical contact.

Notably, FIG. 7 illustrates an exemplary three-dimensional (3D) bonded semiconductor structure of the present application. The illustrated 3D bonded semiconductor structure includes a first semiconductor structure 10A comprising a first dielectric material layer 14A, wherein the first dielectric material layer 14A comprises at least a first U-shaped metal liner 22A' lining a first opening 16A present in the first dielectric material layer 14A and a first metallic structure 26A having a convex outermost surface 28A present in the first opening 16A and in direct contact with the first U-shaped metal liner 22A'. The 3D bonded semiconductor structure further includes a second semiconductor structure 10B comprising a second dielectric material layer 14B, wherein the second dielectric material layer 14B comprises at least a second U-shaped metal liner 20B' lining a second opening 16B present in the second dielectric material layer 14B and a second metallic structure 26B having a concave outermost surface 28B present in the second opening 16B and in direct contact with the second U-shaped metal liner 20B'. In accordance with the present application, a metal-to-metal bonding interface 50 is present between the convex outermost surface 28A of the first metallic structure 26A and the concave outermost surface 28B of the second metallic structure 26B.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A three-dimensional (3D) bonded semiconductor structure comprising:
   a first semiconductor structure comprising a first dielectric material layer, wherein the first dielectric material layer comprises at least a first U-shaped metal liner lining a first opening present in the first dielectric material layer and a first metallic structure having a convex outermost surface present in the first opening and in direct contact with the first U-shaped metal liner; and
   a second semiconductor structure comprising a second dielectric material layer, wherein the second dielectric material layer comprises at least a second U-shaped metal liner lining a second opening present in the second dielectric material layer and a second metallic structure having a concave outermost surface present in the second opening and in direct contact with the second U-shaped metal liner, wherein a metal-to-metal bonding interface is present between the convex outermost surface of the first metallic structure and the concave outermost surface of the second metallic structure.

2. The 3D bonded semiconductor structure of claim 1, wherein the first U-shaped metal liner comprises a first metal, the second U-shaped metal liner comprises a second metal, and the first and second metallic structures comprise a metal or metal alloy, wherein the first metal is different from the second metal, and wherein the first and second metals are different from the metal or metal alloy of the first and second metallic structures.

3. The 3D bonded semiconductor structure of claim 2, wherein the first metal is a metal that has a negative galvanic reaction to the metal or metal alloy of the first metallic structure, while the second metal has a positive galvanic reaction to the metal or metal alloy of the second metallic structure.

4. The 3D bonded semiconductor structure of claim 3, wherein the metal or metal alloy of the first metallic structure is the same as the metal or metal alloy of the second metallic structure.

5. The 3D bonded semiconductor structure of claim 3, wherein the first metal is cobalt, the second metal is ruthenium and the metal or metal alloy of both the first metallic structure and the second metallic structure is copper.

6. The 3D bonded semiconductor structure of claim 1, further comprising a first U-shaped diffusion barrier liner positioned between the first U-shaped metal liner and the first dielectric material layer, and a second U-shaped diffusion barrier liner positioned between the second U-shaped metal liner and the second dielectric material layer.

7. The 3D bonded semiconductor structure of claim 1, wherein the first U-shaped metal liner is in direct contact with exposed surfaces of the first dielectric material layer provided by the first opening.

8. The 3D bonded semiconductor structure of claim 7, wherein the second U-shaped metal liner is in direct contact with exposed surfaces of the second dielectric material layer provided by the second opening.

9. The 3D bonded semiconductor structure of claim 1, wherein the first semiconductor structure further comprises a first semiconductor wafer located on a surface of the first dielectric material layer, and the second semiconductor structure further comprises a second semiconductor wafer located on a surface of the second dielectric material layer.

10. The 3D bonded semiconductor structure of claim 1, wherein each of the first semiconductor wafer and the second semiconductor wafer comprises a semiconductor substrate containing one or more semiconductor devices.

11. A method of forming a three-dimensional (3D) bonded semiconductor structure, the method comprising:
    providing a first semiconductor structure comprising a first dielectric material layer, wherein the first dielectric material layer comprises at least a first U-shaped metal liner lining a first opening present in the first dielectric material layer and a first metallic structure having a convex outermost surface present in the first opening and in direct contact with the first U-shaped metal liner;
    providing a second semiconductor structure comprising a second dielectric material layer, wherein the second dielectric material layer comprises at least a second U-shaped metal liner lining a second opening present in the second dielectric material layer and a second metallic structure having a concave outermost surface present in the second opening and in direct contact with the second U-shaped metal liner; and
    bonding the first semiconductor structure to the second semiconductor structure, wherein the bonding provides a metal-to-metal bonding interface between the convex outermost surface of the first metallic structure and the concave outermost surface of the second metallic structure.

12. The method of claim 11, wherein the providing the first semiconductor structure comprises:
    forming the first opening into the first dielectric material layer;
    forming a first liner system comprising at least a first metal liner within the first opening and atop the first dielectric material layer;
    forming a first layer of a metal or metal alloy on the first metal liner, wherein the first metal liner comprises a first metal that has a negative galvanic reaction to the metal or metal alloy of the first layer of metal or metal alloy; and
    performing a planarization process.

13. The method of claim 12, wherein the first liner system further comprising a first diffusion barrier liner, the first diffusion barrier liner is formed prior to forming the first metal liner.

14. The method of claim 11, wherein the providing the second semiconductor structure comprises:
    forming the second opening into the second dielectric material layer;

forming a second liner system comprising at least a second metal liner within the second opening and atop the second dielectric material layer;

forming a second layer of a metal or metal alloy on the second metal liner, wherein the second metal liner comprises a second first metal that has a positive galvanic reaction to the metal or metal alloy of the second layer of metal or metal alloy; and performing a planarization process.

15. The method of claim 14, wherein the second liner system further comprising a second diffusion barrier liner, the second diffusion barrier liner is formed prior to forming the second metal liner.

16. The method of claim 11, wherein the first U-shaped metal liner comprises a first metal, the second U-shaped metal liner comprises a second metal, and the first and second metallic structures comprise a metal or metal alloy, wherein the first metal is different from the second metal, and wherein the first and second metals are different from the metal or metal alloy of the first and second metallic structures.

17. The method of claim 16, wherein the first metal is a metal that has a negative galvanic reaction to the metal or metal alloy of the first metallic structure, while the second metal has a positive galvanic reaction to the metal or metal alloy of the second metallic structure.

18. The method of claim 17, wherein the metal or metal alloy of the first metallic structure is the same as the metal or metal alloy of the second metallic structure.

19. The method of claim 16, wherein the first metal is cobalt, the second metal is ruthenium and the metal or metal alloy of the first metallic structure and the second metallic structure is copper.

20. The method of claim 11, wherein the bonding comprises:
performing wafer-to-wafer alignment;
bringing the first semiconductor structure into intimate contact with the second semiconductor structure; and
annealing the contacted first and second semiconductor structures to cause the metal-to-metal bonding.

* * * * *